United States Patent
Zhang et al.

(10) Patent No.: US 12,431,912 B2
(45) Date of Patent: Sep. 30, 2025

(54) MISMATCH ERROR CALIBRATION METHOD AND APPARATUS OF A TIME INTERLEAVING DIGITAL-TO-ANALOG CONVERTER

(71) Applicant: FUJITSU LIMITED, Kawasaki (JP)

(72) Inventors: Ke Zhang, Beijing (CN); Zhenning Tao, Beijing (CN)

(73) Assignee: FUJITSU LIMITED, Kawasaki (JP)

( * ) Notice: Subject to any disclaimer, the term of this patent is extended or adjusted under 35 U.S.C. 154(b) by 166 days.

(21) Appl. No.: 18/384,001

(22) Filed: Oct. 26, 2023

(65) Prior Publication Data

US 2024/0178853 A1    May 30, 2024

(30) Foreign Application Priority Data

Nov. 29, 2022   (CN) .............................. 202211506942

(51) Int. Cl.
*H03M 1/10*      (2006.01)
*H03M 1/12*      (2006.01)

(52) U.S. Cl.
CPC ....... *H03M 1/1023* (2013.01); *H03M 1/1009* (2013.01); *H03M 1/121* (2013.01)

(58) Field of Classification Search
CPC ... H03M 1/1023; H03M 1/1009; H03M 1/121
See application file for complete search history.

(56) References Cited

U.S. PATENT DOCUMENTS 10,355,706 B1 *  7/2019  Stein ................... H03M 1/0612
10,461,764 B1 * 10/2019  Paro Filho .......... H03M 1/1033

OTHER PUBLICATIONS

Galetto et al., "Backpropagation Based Background Compensation of TI-DAC Errors in High-Speed Transmitters", 2022 IEEE 65th International Midwest Symposium on Circuits and Systems (MWSCAS). IEEE.
Solis et al., "Error-Backpropagation-Based Background Calibration of TI-ADC for Adaptively Equalized Digital Communication Receivers", Received Aug. 23, 2022, accepted Sep. 11, 2022, date of publication Sep. 20, 2022, date of current version Oct. 3, 2022, Digital Object Identifier 10.1109/ACCESS.2022.3208092.

(Continued)

*Primary Examiner* — Khai M Nguyen
(74) *Attorney, Agent, or Firm* — STAAS & HALSEY LLP

(57) ABSTRACT

A mismatch error calibration method and apparatus of a time interleaved digital-to-analog converter. The method includes: sampling an output signal of a time interleaved digital-to-analog converter to obtain a measurement signal; preprocessing the measurement signal to obtain a preprocessed measurement signal; and estimating a coefficient of a digital impairment equalizer according to an input signal of the digital impairment equalizer, an output signal of the digital impairment equalizer, and the preprocessed measurement signal. By preprocessing a non-ideal feedback channel, interferences caused by non-ideality of the feedback channel is eliminated, so as to achieve better mismatch error calibration performance of a TI-DAC.

10 Claims, 7 Drawing Sheets

(56) References Cited

OTHER PUBLICATIONS

Galetto et al., "Adaptive Background Compensation of Frequency Interleaved DACs With Application to Coherent Optical Transceivers", Received Feb. 16, 2021, accepted Feb. 28, 2021, date of publication Mar. 10, 2021, date of current version Mar. 22, 2021, Digital Object Identifier 10.1109/ACCESS.2021.3065269.
Solis et al., "On the Application of Error Backpropagation to the Background Calibration of Time Interleaved ADC for Digital Communication Receivers", arXiv:2008.02914v1 [eess.SP] Aug. 7, 2020.

* cited by examiner

MISMATCH ERROR CALIBRATION METHOD AND APPARATUS OF A TIME INTERLEAVING DIGITAL-TO-ANALOG CONVERTER

CROSS-REFERENCE TO RELATED APPLICATIONS

This application is based on and hereby claims priority to Chinese Application No. 202211506942.8, filed Nov. 29, 2022, in the China National Intellectual Property Administration, the disclosure of which is incorporated herein by reference.

FIELD

The present disclosure relates to the communication field, in particular to a mismatch error calibration method and apparatus of a time-interleaved digital-to-analog converter.

BACKGROUND

A Time-Interleaved Digital-to-Analog Converter (TI-DAC) has been widely applied in high-speed signal modulation and high-speed digital signal processing. Generally, the TI-DAC contains a plurality of sub-DACs, while mismatch errors such as time mismatch, gain imbalance and DC bias imbalance, etc. between sub-DACs may cause serious signal distortion. Although DAC manufacturers calibrate these mismatch errors at a device level, there will still be some residual errors, which need to be eliminated via a digital technology.

It should be noted that the above introduction to the technical background is just to facilitate a clear and complete description of the technical solutions of the present disclosure, and is elaborated to facilitate the understanding of persons skilled in the art. It cannot be considered that the above technical solutions are known by persons skilled in the art just because these solutions are elaborated in the Background of the present disclosure.

SUMMARY

According to an embodiment of the present disclosure, a mismatch error calibration apparatus of a time interleaved digital-to-analog converter is provided. The mismatch error calibration apparatus includes a memory and a processor coupled to the memory to control execution of a process to: sample an output signal of the time interleaved digital-to-analog converter to obtain a measurement signal: preprocess the measurement signal to obtain a preprocessed measurement signal: and estimate a coefficient of a digital impairment equalizer according to an input signal of the digital impairment equalizer, an output signal of the digital impairment equalizer, and the preprocessed measurement signal.

According to an embodiment of the present disclosure, a mismatch error calibration method of a time interleaved digital-to-analog converter is provided. The mismatch error calibration method includes: sampling an output signal of the time interleaved digital-to-analog converter to obtain a measurement signal: preprocessing the measurement signal to obtain a preprocessed measurement signal: and estimating a coefficient of a digital impairment equalizer according to an input signal of the digital impairment equalizer, an output signal of the digital impairment equalizer, and the preprocessed measurement signal.

Referring to the following descriptions and drawings, the specific implementations of the present disclosure are disclosed in detail, the ways in which the principle of the present disclosure can be adopted and pointed out. It should be understood that the implementations of the present disclosure are not limited in terms of the scope. Within the scope of the terms of the appended claims, the implementations of the present disclosure include many changes, modifications and equivalents.

Features that are described and/or illustrated with respect to one implementation can be used in the same way or in a similar way in one or more other implementations, can be combined with or replace features in the other implementations.

It should be emphasized that the term "comprise/comprising/include/including" when being used herein refers to the presence of features, integers, operations (steps) or components, but does not preclude the presence or addition of one or more other features, integers, operations (steps) or components.

BRIEF DESCRIPTION OF THE DRAWINGS

Elements and features described in one drawing or implementation of the present embodiments of the present disclosure may be combined with elements and features shown in one or more other drawings or implementations. In addition, in the drawings, similar reference numerals represent corresponding components in several drawings, and can be used to indicate corresponding components used in more than one implementations.

The included drawings are used to provide a further understanding on the embodiments of the present disclosure, constitute a part of the specification, are used to illustrate the implementations of the present disclosure, and expound the principle of the present disclosure together with the text description. Obviously, the drawings in the following description are only some embodiments of the present disclosure. Persons skilled in the art can also obtain other drawings based on these drawings under the premise that they do not pay inventive labor.

In the drawings:

FIG. 1 is a schematic diagram of a mismatch error calibration method of a time interleaved digital-to-analog converter according to an embodiment of the present disclosure:

FIG. 2 is a schematic diagram of obtaining an input signal of a time interleaved digital-to-analog converter according to an embodiment of the present disclosure:

FIG. 3 is a schematic diagram of estimating a coefficient of a digital impairment equalizer according to an embodiment of the present disclosure:

FIG. 4 is a flow diagram of a mismatch error calibration method of a time interleaved digital-to-analog converter according to an embodiment of the present disclosure:

FIG. 5 is a schematic diagram of an example of a structure of a FIR filter for preprocessing according to an embodiment of the present disclosure:

FIG. 6 is a flow diagram of processing process of an Error Backpropagation (EBP)-based digital impairment equalizer coefficient estimator according to an embodiment of the present disclosure:

FIG. 7 is a schematic diagram of a mismatch error calibration apparatus of a time interleaved digital-to-analog converter according to an embodiment of the present disclosure:

FIG. 8 is a schematic diagram of a communication system according to an embodiment of the present disclosure:

FIG. 9 is a schematic diagram of an example of a digital impairment equalizer coefficient estimator according to an embodiment of the present disclosure.

DETAILED DESCRIPTION

Figure 1:
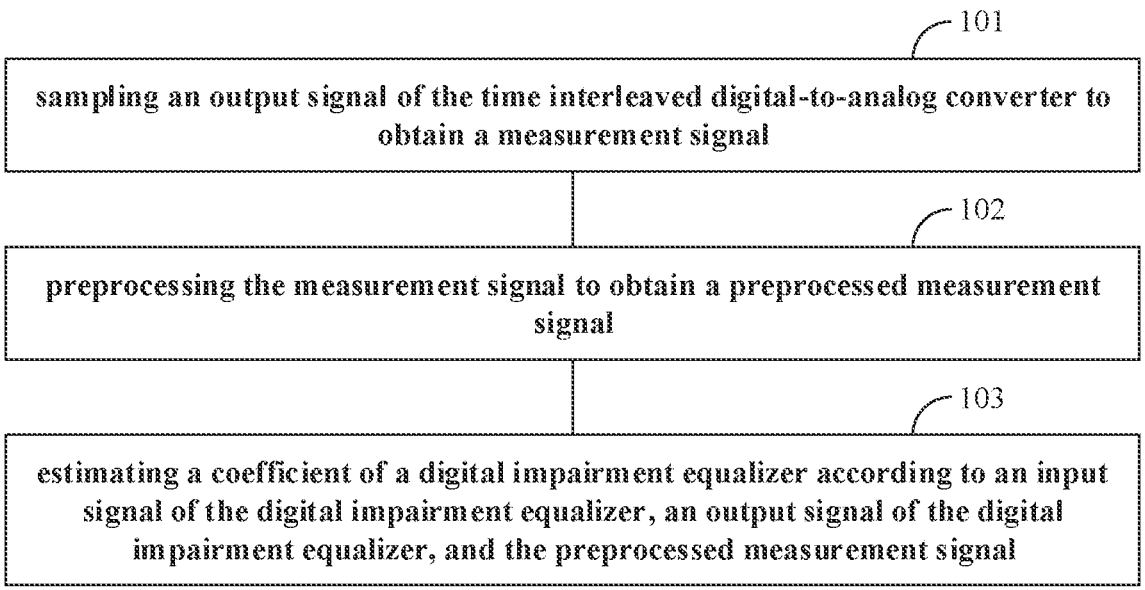

Referring to the drawings, through the following description, the above and other features of the present disclosure will become obvious. The description and the drawings specifically disclose particular implementations of the present disclosure, showing partial implementations which can adopt the principle of the present disclosure. It should be understood that the present disclosure is not limited to the described implementations, on the contrary, the present disclosure includes all the modifications, variations and equivalents falling within the scope of the appended claims.

In the embodiments of the present disclosure, the terms "first" and "second", etc. are used to distinguish different elements in terms of appellation, but do not represent a spatial arrangement or time sequence, etc. of these elements, and these elements should not be limited by these terms. The term "and/or" includes any and all combinations of one or more of the associated listed terms. The terms "include", "comprise" and "have", etc. refer to the presence of stated features, elements, members or components, but do not preclude the presence or addition of one or more other features, elements, members or components.

In the embodiments of the present disclosure, the singular forms "a/an" and "the", etc. include plural forms, and should be understood broadly as "a kind of" or "a type of", rather than being limited to the meaning of "one": in addition, the term "the" should be understood to include both the singular forms and the plural forms, unless the context clearly indicates otherwise. In addition, the term "according to" should be understood as "at least partially according to . . . ", the term "based on" should be understood as "at least partially based on . . . ", unless the context clearly indicates otherwise.

Various implementations of the embodiments of the present disclosure will be described below with reference to the drawings.

The inventor finds that under the assumption that an output waveform of a TI-DAC can be obtained directly, that is, there exists an ideal feedback channel, an Error Back-propagation (EBP)-based compensation method can be used to calibrate the mismatch errors. However, the assumption of "ideal feedback channel" is not satisfied in practice. For example, in an actual system structure, the print circuit board (PCB), coaxial cables and connectors after the TI-DAC as well as the waveform sampling and measuring equipment, e.g., the digital storage oscilloscope (DSO), are all not ideal straight-through system and will introduce certain interference, thereby limiting the compensation performance of the EBP.

Regarding the above problem, the embodiments of the present disclosure provide a mismatch error calibration method and apparatus of a time interleaved digital-to-analog converter, by preprocessing a non-ideal feedback channel to eliminate the interference caused by non-ideality of the feedback channel, so as to achieve better mismatch error calibration performance of a TI-DAC.

One of the advantages of the embodiments of the present disclosure is that: according to the embodiments of the present disclosure, by preprocessing a non-ideal feedback channel to eliminate the interferences caused by non-ideality of the feedback channel, so as to achieve better mismatch error calibration performance of a TI-DAC.

An embodiment of the present disclosure provide a mismatch error calibration method of a time interleaved digital-to-analog converter.

FIG. 1 is a schematic diagram of a mismatch error calibration method of a time interleaved digital-to-analog converter in the embodiments of the present disclosure, as shown in FIG. 1, the method includes:

101: sampling an output signal of the time interleaved digital-to-analog converter to obtain a measurement signal:

102: preprocessing the measurement signal to obtain a preprocessed measurement signal: and

103: estimating a coefficient of a digital impairment equalizer according to an input signal of the digital impairment equalizer, an output signal of the digital impairment equalizer, and the preprocessed measurement signal.

It should be noted that the above FIG. 1 is only schematic description of the embodiments of the present disclosure, but the present disclosure is not limited to this. For example, the operations can be adjusted appropriately, moreover other some operations can be increased or some operations therein can be reduced. Persons skilled in the art can make appropriate modifications according to the above contents, not limited to the records in the above FIG. 1.

According to the embodiments of the present disclosure, by preprocessing a non-ideal feedback channel (a non-ideal measurement signal), interferences introduced by a non-ideal measurement feedback channel is eliminated, so as to achieve better mismatch error calibration performance of a TI-DAC.

In the embodiments of the present disclosure, in the operation 101, an output signal of a time interleaved digital-to-analog converter can be sampled via a non-ideal measurement feedback channel, and the obtained measurement signal is a discrete digital signal. Since the non-ideal measurement feedback channel includes all actual physical connection devices and receiving equipment(s) located after the time interleaved digital-to-analog converter, such as PCBs, coaxial cables, digital storage oscilloscopes (DSOs) and so on, all these devices and equipment(s) are not be ideal straight-through systems, thereby certain impairments and interference are introduced into the obtained measurement signal. These impairments are different from a mismatch error of a time interleaved digital-to-analog converter, and are a kind of interference common to each sample data in a measurement signal. Compared with a low-speed signal (such as an output signal of a digital impairment equalizer), these impairments may be regarded as inter-sample interference of a high-speed signal, and such interference does not exist in an actual output signal of the time interleaved digital-to-analog converter per se, and is purely brought by non-ideal measurement.

In the embodiments of the present disclosure, in the operation 102, by preprocessing the measurement signal, interferences introduced by the non-ideal measurement feedback channel can be removed, thereby a preprocessed measurement signal is obtained.

In some embodiments, the input signal of the time interleaved digital-to-analog converter can be taken as a reference, and the measurement signal can be filtered by using a Finite Impulse Response (FIR) filter, so as to obtain the pre-processed measurement signal.

Figure 2:
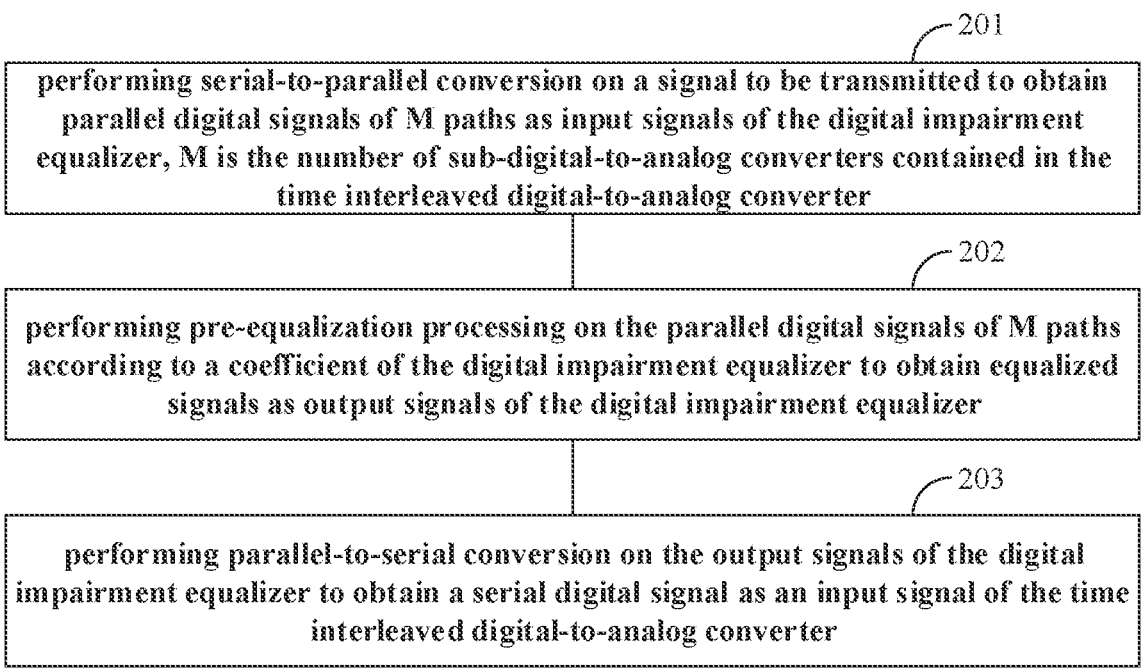

In the embodiments of the present disclosure, an input signal of a time interleaved digital-to-analog converter can be obtained via the method of FIG. 2, as shown in FIG. 2, the method includes:

201: performing serial-to-parallel conversion on a signal to be transmitted to obtain parallel digital signals of M paths as input signals of the digital impairment equalizer, M is the number of sub digital-to-analog converters contained in the time interleaved digital-to-analog converter:

202: performing pre-equalization processing on the parallel digital signals of M paths according to a coefficient of the digital impairment equalizer to obtain equalized signals as output signals of the digital impairment equalizer: and

203: performing parallel-to-serial conversion on the output signals of the digital impairment equalizer to obtain a serial digital signal as an input signal of the time interleaved digital-to-analog converter.

In the embodiments of the present disclosure, assuming that a time interleaved digital-to-analog converter to be calibrated contains M sub digital-to-analog converters (referred to as sub-DACs) in total, then, in the operation 201, serial digital signals to be transmitted may be converted into parallel digital signals of M paths: in the operation 202, pre-equalization processing on a parallel digital signal of each path may be performed via a digital impairment equalizer, to obtain equalized signals as output signals of the digital impairment equalizer: and in the operation 203, the output parallel digital signal of the digital impairment equalizer may be converted into a serial digital signal as an input signal of the time interleaved digital-to-analog converter.

In the above embodiment, the digital impairment equalizer is composed of a M×M multi-input multi-output finite impulse response filter and a coefficient vector for compensating direct current bias of a sub digital-to-analog converter of each path. That is, corresponding to a parallel digital signal of each path, the digital impairment equalizer is composed of M FIR filters with the number of taps being N, and a coefficient for compensating direct current bias.

In some embodiments, the digital impairment equalizer can take into account the crosstalk between sub-DACs, that is, the digital impairment equalizer may perform equalization processing on the crosstalk between sub-DACs. In some other embodiments, since the crosstalk between sub-DACs has little effect on mismatch calibration of the time interleaved digital-to-analog converter in the embodiments of the present disclosure, the crosstalk between sub-DACs can also be ignored, that is, there is no need to perform equalization processing on the crosstalk between sub-DACs.

Figure 3:
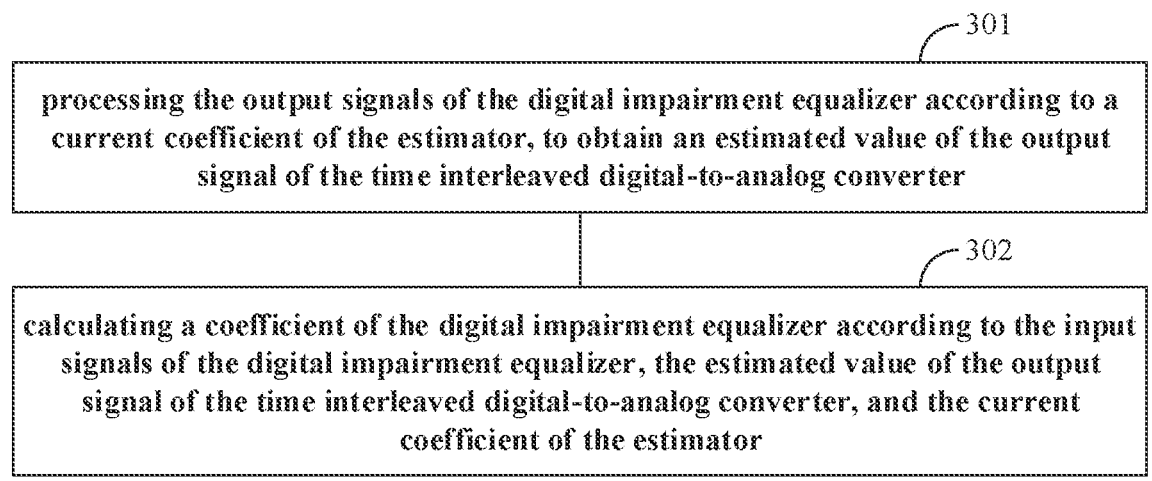

In the embodiments of the present disclosure, in the operation 103, a coefficient of a digital impairment equalizer may be estimated by using the method shown in FIG. 3. As shown in FIG. 3, the method includes:

301: processing the output signals of the digital impairment equalizer according to a current coefficient of the estimator, to obtain an estimated value of the output signal of the time interleaved digital-to-analog converter: and

302: calculating a coefficient of the digital impairment equalizer according to the input signals of the digital impairment equalizer, the estimated value of the output signal of the time interleaved digital-to-analog converter, and the current coefficient of the estimator.

In the above embodiment, a coefficient of the estimator may be obtained by calculating according to the preprocessed measurement signal. For example, serial-to-parallel conversion may be performed on the preprocessed measurement signal, to obtain parallel digital signals of M paths: then the coefficient of the estimator is calculated by using the parallel digital signals of M paths, the output signals of the digital impairment equalizer and the estimated value of the output signal of the time interleaved digital-to-analog converter.

In the above embodiment, the estimator is composed of a M×M multi-input multi-output finite impulse response filter and a coefficient vector for characterizing direct current bias of a sub digital-to-analog converter of each path. That is, corresponding to an output signal of each path of the digital impairment equalizer, the estimator is composed of M FIR filters with the number of taps being K, and a coefficient for characterizing direct current bias.

In some embodiments, the estimator may take into account crosstalk between sub-DACs, that is, the estimator estimates the crosstalk between sub-DACs. In some other embodiments, since the crosstalk between sub-DACs has little effect on mismatch calibration of the time interleaved digital-to-analog converter in the embodiments of the present disclosure, the crosstalk between sub-DACs may also be ignored, that is, there is no need to estimate the crosstalk between sub-DACs.

The method in the embodiments of the present disclosure is illustrated below in conjunction with a specific example.

Figure 4:
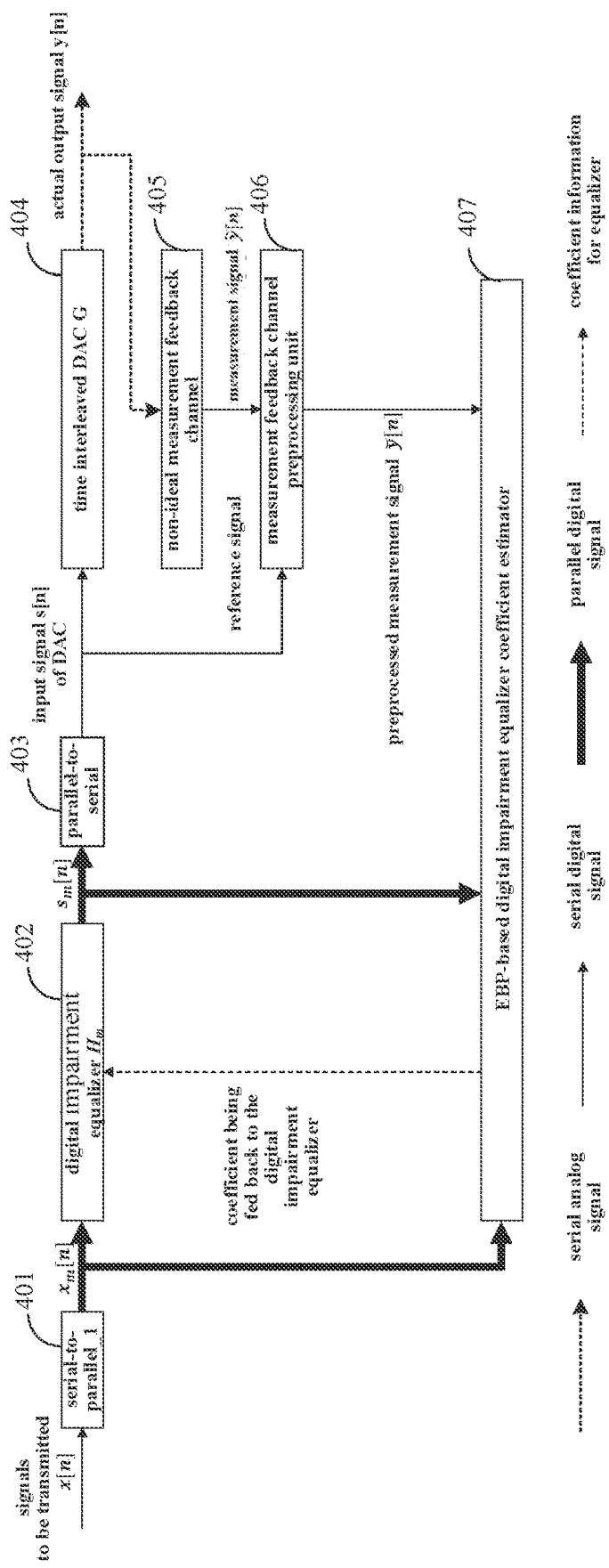

FIG. 4 is a flow diagram of a mismatch error calibration method of a time interleaved digital-to-analog converter in the embodiments of the present disclosure, as shown in FIG. 4, the procedure includes:

401: serial-to-parallel conversion:
402: pre-equalization:
403: parallel-to-serial conversion:
404: digital-to-analog conversion:
405: sampling:
406: pre-processing:
407: coefficient estimation.

In the operation 401, assuming that a time interleaved digital-to-analog converter to be calibrated contains M sub-DACs in total, then serial digital signals $x[n]$ to be transmitted are converted into parallel digital signals $x_m[n]$ of M paths. m corresponds to the m-th sub-DAC of the time interleaved digital-to-analog converter, that is, the m-th path parallel signal $x_m[n]$ will be assigned to the m-th sub-DAC.

In the operation 402, the m-path parallel signal $x_m[n]$ is pre-equalized via the digital impairment equalizer $H_m$ and an equalized signal $s_m[n]$ is output. $H_m$ may be composed of M FIR filters with the number of taps being N, i.e., $h_{mi}[l]$ (l=0, 1, 2, ..., N−1, i=1, 2, 3, ... M), and a coefficient $h_m^b$ used for compensating direct current bias, its output signal may be represented as follows:

$$s_m[n]=\Sigma_{i=1}^{M}\Sigma_{l=0}^{N-1}h_{mi}[l]x_i[n-l]\alpha h_m^b$$

In the above example, when i≠m, $h_{mi}[l]$ is used to compensate for the crosstalk from the i-th sub-DAC to the m-th sub-DAC. Moreover, since all $x_i[n]$ (i=1, 2, 3, ..., M) participate the calculation in generating the $s_m[n]$, thus $H_m$ may be equivalently understood as an equalizer operating at a full-speed sampling rate.

In the above example, all $H_m$ constitute a M×M Multiple Input Multiple Output (MIMO) FIR filter and a coefficient vector $[h_1^b, h_2^b, ..., h_M^b]^T$ for compensating direct current bias of each sub-DAC. The mathematical representation is listed as follows:

$$H = [H_1; H_2; \ldots; H_M]^T = \begin{bmatrix} h_{11} & \cdots & h_{1M} \\ \vdots & \ddots & \vdots \\ h_{M1} & \cdots & h_{MM} \end{bmatrix} + \begin{bmatrix} h_1^b \\ \vdots \\ h_M^b \end{bmatrix}$$

In the above example, all equalized parallel signals $s_m[n]$ are written in a matrix form $S=[\iota_1[n], s_2[n], \ldots, s_M[n]]^T$. S may be further represented as:

$$S = \begin{bmatrix} s_1[n] \\ \vdots \\ s_M[n] \end{bmatrix} = \begin{bmatrix} \sum_{i=1}^{M} h_{1i} * x_i[n] \\ \vdots \\ \sum_{i=1}^{M} h_{Mi} * x_i[n] \end{bmatrix} + \begin{bmatrix} h_1^b \\ \vdots \\ h_M^b \end{bmatrix}$$

wherein, * represented convolution operation.

In the above example, when a mismatch error of a time interleaved digital-to-analog converter is compensated via a digital impairment equalizer H, crosstalk between sub-DACs is considered, the present disclosure is not limited to this. In some embodiments, interaction between sub-DACs may not be considered, that is, when i≠m, $h_{mi}[l]=0$, then a MIMO filter in H is degenerated into a diagonal matrix, which is mathematically described as follows:

$$H = [H_1; H_2; \ldots; H_M]^T = \begin{bmatrix} h_{11} & \cdots & 0 \\ \vdots & \ddots & \vdots \\ 0 & \cdots & h_{MM} \end{bmatrix} + \begin{bmatrix} h_1^b \\ \vdots \\ h_M^b \end{bmatrix}$$

That is, the processing for the sub-DACs by His parallel and independent of each other and do not influence each other. In this case, the mathematical description of S may be simplified as:

$$S = \begin{bmatrix} s_1[n] \\ \vdots \\ s_M[n] \end{bmatrix} = \begin{bmatrix} h_{11} * x_i[n] \\ \vdots \\ h_{MM} * x_M[n] \end{bmatrix} + \begin{bmatrix} h_1^b \\ \vdots \\ h_M^b \end{bmatrix}$$

According to the above embodiment, in this case, $H_m$ actually contains only one FIR filter $h_{mm}$, thus the total number of taps required may be greatly reduced, for example to 3 or 5. This may greatly reduce the complexity of the digital impairment equalizer, thereby reducing the complexity of the calibration method in the embodiments of the present disclosure. Moreover, considering that the interaction between sub-DACs of the time interleaved converter is generally small, it will not have a significant impact on the performance of the digital impairment equalizer.

In the operation 403, the parallel digital signal $s_m[n]$ output by the digital impairment equalizer $H_m$ is converted to a serial digital signal s[n].

In the operation 404, the time interleaved digital-to-analog converter G is used to perform the above digital-to-analog conversion, wherein the time interleaved digital-to-analog converter G is a time interleaved digital-to-analog converter to be calibrated, and G represents a transfer function of an overall system. As an actual physical device, the time interleaved digital-to-analog converter receives an input discrete serial digital signal s[n] and converts it to a corresponding serial analog signal y[n].

In the operation 405, an output signal y[n] of the time interleaved digital-to-analog converter is sampled via a non-ideal measurement feedback channel, and a corresponding measurement signal ỹ[n] is obtained.

In the above example, ỹ[n] is a discrete digital signal. The non-ideal measurement feedback channel includes all the actual physical connection devices and receiving equipment(s) located after the time interleaved digital-to-analog converter, i.e., PCBs, coaxial cables, connectors and DSOs. These devices and equipment(s) are not ideal straight-through systems, thereby certain impairments and interferences are introduced in ỹ[n]. These impairments are different from the mismatch errors of the time interleaved digital-to-analog converter and are a common interference to each sample data in ỹ[n]. Compared with a low-speed $s_m[n]$ signal, this may be regarded as inter-sample interference of a high-speed signal, and this interference does not exist in an actual output signal y[n] of the time interleaved digital-to-analog converter per se, and is purely brought by non-ideal measurement.

In the operation 406, by using a known input signal s[n] of the time interleaved digital-to-analog converter as a reference signal, the measurement signal ỹ[n] output by the non-ideal measurement feedback channel is preprocessed to eliminate the interference introduced by the non-ideal measurement feedback channel, and the preprocessed measurement signal ẙ[n] is output.

In the above example, the above preprocessing may be performed via the FIR filter f[q]. Assuming that the number of taps is Q+1, the mathematical description of the preprocessing is listed as follows:

$$ẙ[n]=\Sigma_{t=0}^{Q}f[q]ỹ[n-q]$$

wherein, parameter solving of f[q] may be based on a minimum mean square error (MMSE) method, and may also be based on a least mean square (LMS) algorithm, other parameter solving methods may also be used, which will not be described in details here.

Figure 5:
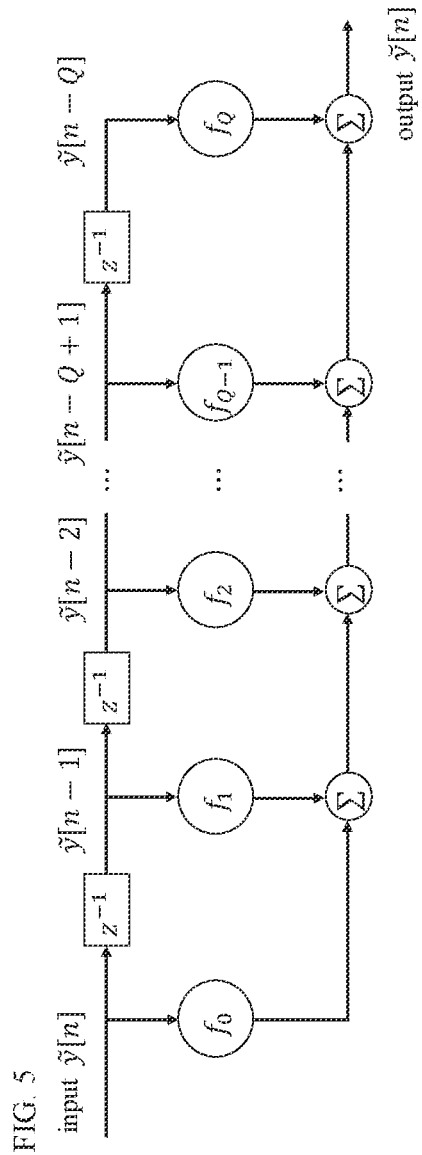

FIG. 5 is a schematic diagram of an example of a structure of a FIR filter for preprocessing, the present disclosure is not limited to this, related technologies may be referred to for details.

In the operation 407, by using a known input signal $x_m[n]$ and an output signal $s_m[n]$ of a digital impairment equalizer and a preprocessed measurement signal ẙ[n], a new coefficient of a digital impairment equalizer is estimated by using an error backpropagation algorithm. And the coefficient is fed back to the digital impairment equalizer for parameter updating. Since the interferences introduced by a non-ideal measurement feedback channel is eliminated, the digital impairment equalizer can compensate a mismatch error of a time interleaved digital-to-analog converter with lower complexity (that is, without considering a mutual effect between sub digital-to-analog converters), meanwhile avoids the influence of the above interferences on the performance of the digital impairment equalizer.

Figure 6:
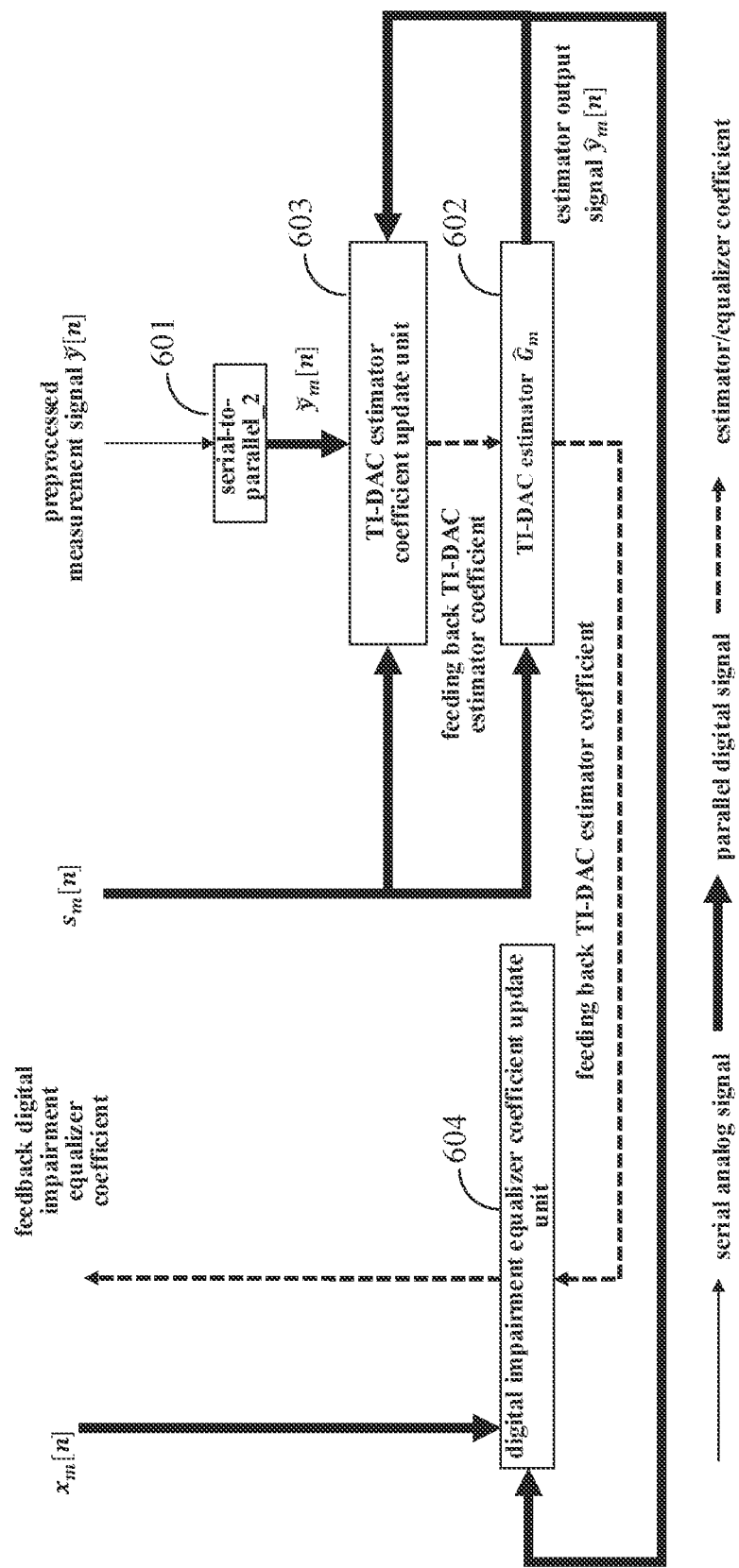

FIG. 6 is a flow diagram of processing process of an Error Backpropagation (EBP)-based digital impairment equalizer coefficient estimator. As shown in FIG. 6, the process includes:
  601: serial-to-parallel conversion:
  602: time interleaved digital-to-analog converter estimation:
  603: updating of an estimator coefficient:
  604: updating of a coefficient of a digital impairment equalizer.

In the operation 601, the preprocessed measurement signal ẙ[n] is converted into M paths parallel signal ẙm[n], and m corresponds to the m-th sub-DAC of the time interleaved digital-to-analog converter. Specific working mode is same as that in the operation 401 of FIG. 4, detailed description is omitted here.

In the operation 602, an estimator $\hat{G}_m$ is used to estimate an output signal of a time interleaved digital-to-analog converter to be calibrated.

In the above example, $\hat{G}_m$ is composed of M FIR filters with the number of taps being K, that is $\hat{g}_{mi}(k)$ (k=0, 1, 2, ..., K–1, i=1, 2, 3, ..., M), and a coefficient $\hat{g}_m^b$ for characterizing direct current bias. $\hat{G}_m$ processes the output signal $s_m[n]$ of the digital impairment equalizer, obtains and outputs an estimated value $\hat{y}_m[n]$ of the output signal of the m-th sub-DAC, the mathematical representation is provided as follows:

$$\hat{y}_m[n]=\Sigma_{i=1}^{M}\sigma_{k=0}^{K-1}\hat{g}_{mi}(k)s_i[n-k]+\hat{g}_m^b$$

In the above example, an estimator coefficient used currently will be fed back to the operation 604, for updating a coefficient of the digital impairment equalizer.

In the above example, when i≠m, $\hat{g}_{mi}(k)$ represents crosstalk from the i-th sub-DAC to the m-th sub-DAC. Thus, $\hat{G}_m$ is also an estimator that works at a full speed sampling rate.

In the above example, all $\hat{G}_m$ forms an M×M MIMO filter and a coefficient vector $[\hat{g}_1^b, \hat{g}_2^b, \ldots, \hat{g}_M^b]^T$ for characterizing direct current bias of each sub-DAC. The mathematical representation is provided as follows:

$$\hat{G}=[\hat{G}_1;\hat{G}_2;\ldots;\hat{G}_M]^T = \begin{bmatrix} \hat{g}_{11} & \cdots & \hat{g}_{1M} \\ \vdots & \ddots & \vdots \\ \hat{g}_{M1} & \cdots & \hat{g}_{MM} \end{bmatrix} + \begin{bmatrix} \hat{g}_1^b \\ \vdots \\ \hat{g}_M^b \end{bmatrix}$$

In the above example, all the estimated signals $\hat{y}_m[n]$ in a parallel form are written in a matrix form $\hat{Y}=[\hat{y}_1[n], \hat{y}_2[n], \ldots, \hat{y}_M[n]]^T$. $\hat{Y}$ can be further represented as:

$$\hat{Y} = \begin{bmatrix} \hat{y}_1[n] \\ \vdots \\ \hat{y}_M[n] \end{bmatrix} = \begin{bmatrix} \sum_{i=1}^{M} \hat{g}_{1i} * s_i[n] \\ \vdots \\ \sum_{i=1}^{M} \hat{g}_{Mi} * s_i[n] \end{bmatrix} + \begin{bmatrix} \hat{g}_1^b \\ \vdots \\ \hat{g}_M^b \end{bmatrix}$$

In the above example, when performing estimation of a time interleaved digital-to-analog converter via the estimator $\hat{G}$, crosstalk between sub-DACs is also considered, the present disclosure is not limited to this. In some embodiments, interaction between sub-DACs may not be considered, that is, when i≠m, $\hat{g}_{mi}[k]=0$, then a MIMO filter in $\hat{G}$ is degenerated into a diagonal matrix, which is mathematically described as follows:

$$\hat{G}=[\hat{G}_1;\hat{G}_2;\ldots;\hat{G}_M]^T = \begin{bmatrix} \hat{g}_{11} & \cdots & 0 \\ \vdots & \ddots & \vdots \\ 0 & \cdots & \hat{g}_{MM} \end{bmatrix} + \begin{bmatrix} \hat{g}_1^b \\ \vdots \\ \hat{g}_M^b \end{bmatrix}$$

That is, processing for each sub-DAC by $\hat{G}$ is parallel and independent of each other and do not influence each other. In this case, the mathematical description of $\hat{Y}$ may be simplified as:

$$\hat{Y} = \begin{bmatrix} \hat{y}_1[n] \\ \vdots \\ \hat{y}_M[n] \end{bmatrix} = \begin{bmatrix} \hat{g}_{11} * s_1[n] \\ \vdots \\ \hat{g}_{MM} * s_M[n] \end{bmatrix} + \begin{bmatrix} \hat{g}_1^b \\ \vdots \\ \hat{g}_M^b \end{bmatrix}$$

According to the above embodiment, $\hat{G}_m$ actually contains only one FIR filter $\hat{g}_{mm}$, thus the total number of taps required may be greatly reduced, for example to 3 or 5. This can greatly reduce the complexity of the estimator, thereby reducing the complexity of the calibration method in the embodiments of the present disclosure. Moreover, considering that the interaction between sub-DACs of the time interleaved converter is generally small, it will not have a significant impact on the performance of the digital impairment equalizer.

In the operation 603, a new estimator coefficient of a time interleaved digital-to-analog converter is calculated by using the signal $\breve{G}_m[n]$ obtained in operation 601, the output signal $s_m[n]$ of the digital impairment equalizer and the estimated signal $\hat{y}_m[n]$ output by the estimator $\hat{G}_m$ of the time interleaved digital-to-analog converter, and the coefficient is fed back to the estimator $\hat{G}_m$ for parameter updating.

In some embodiments, if crosstalk between sub-DACs is taken into account, the calculation and updating method of this parameter is provided as follows:

$$\hat{g}_{mi}[k]|_{t+1}=\hat{g}_{mi}[k]|_t-2\beta_g\langle e_m^g[n]s_i[n-k]\rangle_t, \; k=0,1,2,\ldots,K-1$$

$$\hat{g}_m^b|_{t+1}=\hat{g}_m^b|_t-2\beta_g'\langle e_m^g[n]\rangle_t$$

$$e_m^g[n]=\hat{y}_m[n]-\breve{y}_m[n]$$

wherein, t and t+1 represent coefficients before and after iteration respectively, $\beta_g$ is an updated learning rate of $\hat{g}_{mi}[k]$, and $\beta_g'$ is a parameter updating learning rate of $\hat{g}_m^b$. $\langle \cdot \rangle$ represents average processing, which can be mathematically expressed as:

$$\langle z(n) \rangle = \frac{1}{W}\sum_{n=iW}^{(i+1)W} z(n)$$

wherein, W is an average window length.

In some embodiments, if crosstalk between sub-DACs is not taken into account, the calculation and updating method of this parameter is provided as follows:

$$\hat{g}_{mi}[k]|_{t+1}=\hat{g}_{mi}[k]|_t-2\beta_g\langle e_m^g[n]s_m[n-k]\rangle_t, \; k=0,1,2,\ldots,K-1$$

$$\hat{g}_m^b|_{t+1}=\hat{g}_m^b|_t-2\beta_g'\langle e_m^g[n]\rangle_t$$

$$e_m^g[n]=\hat{y}_m[n]-\breve{y}_m[n]$$

The meaning of each parameter in the above formula is as described above, detailed description is omitted here.

In the operation 604, a new coefficient of a digital impairment equalizer is calculated by using the input signal $x_m[n]$ of the digital impairment equalizer, the estimated signal $\hat{y}_m[n]$ output by the estimator $\hat{G}_m$ and a current coefficient Gm used for obtain the estimated signal $\hat{y}_m[n]$, and the new coefficient is fed back to the digital impairment equalizer for parameter updating.

In some embodiments, if crosstalk between sub-DACs is taken into account, the calculation and updating method of this parameter is provided as follows:

$$h_{mi}[l]|_{t+1}=h_{mi}[l]|_t-2\beta_h\langle e_m^h[n]\Sigma_{k=0}^{K-1}\hat{g}_{mi}[k]x_i[n-l-k]\rangle|_t, \; l=0,1,2,\ldots,N-1$$

$$h_m^b|_{t+1}=h_m^b|_t-\beta_h\langle e_m^h[n]\Sigma_{k=0}^{K-1}\hat{g}_{mi}[k]\rangle|_t$$

$$e_m^h[n]=\hat{y}_m[n]-x_m[n]$$

where, t and t+1 represent coefficients before and after iteration respectively, $\beta_h$ is an updated learning rate of $h_{mi}[l]$, and $\beta'_h$ is a parameter updating learning rate of $h_m^b$.

In some embodiments, if crosstalk between sub-DACs is not taken into account, the calculation and updating method of this parameter is provided as follows:

$$h_{mm}[l]|_{t+1}=h_{mm}[l]|_t-2\beta_h\left(e_m^h[n]\Sigma_{k=0}^{K-1}\hat{g}_{mi}[k]x_i[n-l-k]\right)|_t,\ l=0,1,2,\ldots,N-1$$

$$h_m^b|_{t+1}=h_m^b|_t-\beta_h\left(e_m^h[n]\Sigma_{k=0}^{K-1}\hat{g}_{mm}[k]\right)|_t$$

$$e_m^h[n]=\hat{y}_m[n]-x_m[n]$$

The meaning of each parameter in the above formula is as described above, detailed description is omitted here.

In the embodiments of the present disclosure, the values of the number of taps N, K, Q, the average window length W, and the learning rates $\beta_g g$, $\beta_g'$, $\beta_h n$, $\beta_h'$ are not specifically limited, and can be reasonably selected according to actual needs.

It's worth noting that the above FIGS. 4 and 6 are only schematic description of the embodiments of the present disclosure, but the present disclosure is not limited to this. For example, each operation can be adjusted appropriately, moreover other some operations can be increased or reduced. Persons skilled in the art can make appropriate modifications according to the above contents, not limited to the records in the above FIGS. 4 and 6.

Each of the above embodiments is only illustrative for the embodiments of the present disclosure, but the present disclosure is not limited to this, appropriate modifications can be also made based on the above each embodiment. For example, each of the above embodiments may be used individually, or one or more of the above embodiments may be combined.

According to the method in the embodiments of the present disclosure, by preprocessing a non-ideal measurement signal, interferences introduced by a non-ideal measurement feedback channel are eliminated, which avoids the influence of the interference on the performance of the digital impairment equalizer. In addition, a mismatch error compensation can be performed independently for each sub-DAC, thereby to greatly reduce the complexity of the whole compensation method.

The embodiments of the present disclosure provide a mismatch error calibration apparatus of a time interleaved digital-to-analog converter. The principle of the apparatus to solve the problem is similar to the method in the embodiments of the first aspect, thus its specific implementation can refer to the implementation of the method in the embodiments of the first aspect, the same contents will not be repeated.

Figure 7:
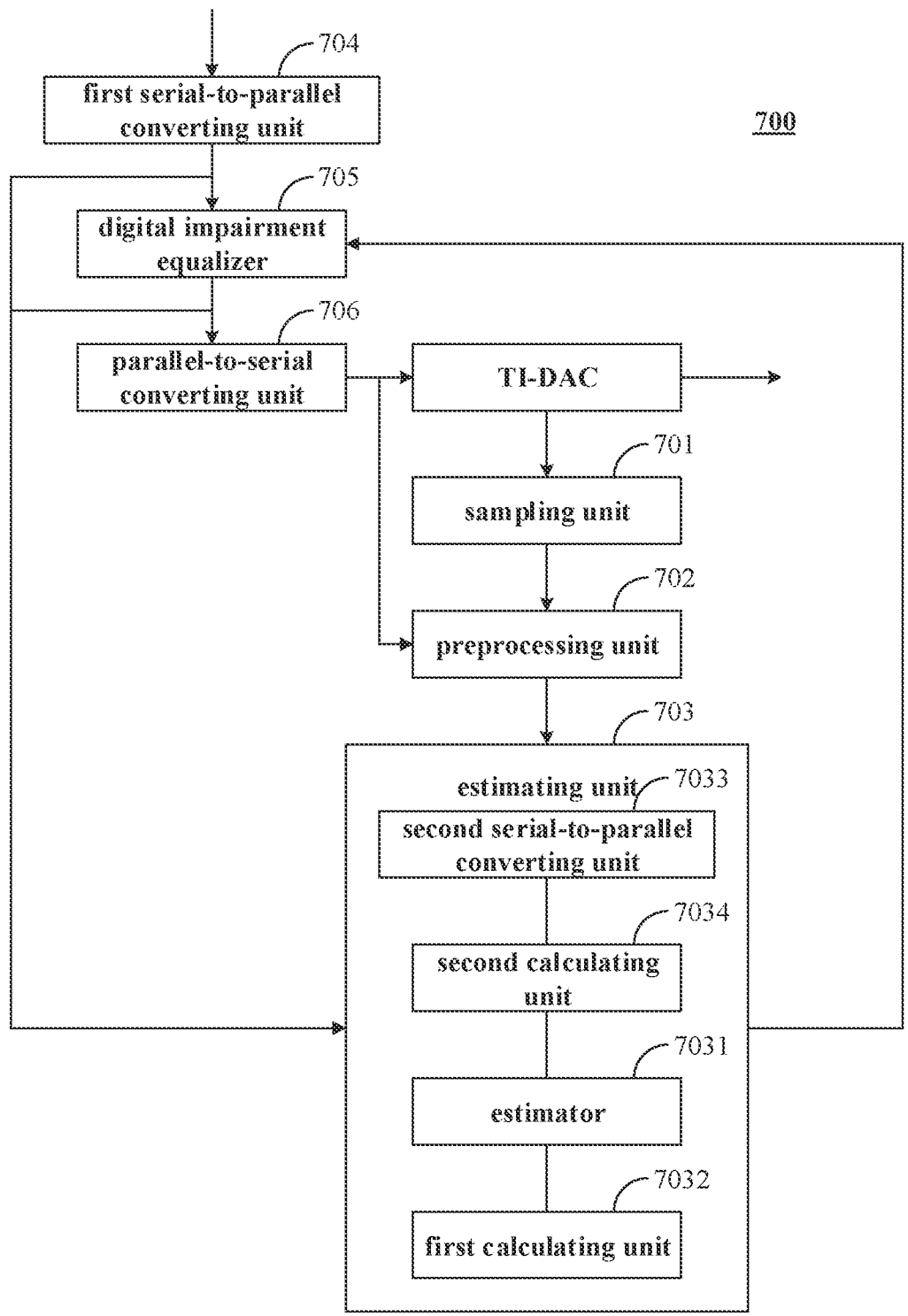

FIG. 7 is a schematic diagram of a mismatch error calibration apparatus of a time interleaved digital-to-analog converter in the embodiments of the present disclosure, as shown in FIG. 7, a mismatch error calibration apparatus 700 of a time interleaved digital-to-analog converter in the embodiments of the present disclosure includes: a sampling unit 701, a preprocessing unit 702 and an estimating unit 703.

In the embodiments of the present disclosure, the sampling unit 701 is configured to sample an output signal of the time interleaved digital-to-analog converter to obtain a measurement signal; the preprocessing unit 702 is configured to preprocess the measurement signal to obtain a preprocessed measurement signal; the estimating unit 702 is configured to estimate a coefficient of a digital impairment equalizer according to an input signal of the digital impairment equalizer, an output signal of the digital impairment equalizer, and the preprocessed measurement signal.

In some embodiments, the measurement signal includes impairments and interferences introduced by a non-ideal measurement feedback channel: the non-ideal measurement feedback channel includes a physical connection device connected to the time interleaved digital-to-analog converter, and a receiving equipment.

In some embodiments, the preprocessing unit 702 takes the input signal of the time interleaved digital-to-analog converter as a reference, and filters the measurement signal by using a finite impulse response (FIR) filter, so as to obtain the pre-processed measurement signal.

In the above embodiments, operations of the sampling unit 701 may refer to the operation 405 in FIG. 4, operations of the preprocessing unit 702 may refer to the operation 406 in FIG. 4, and operations of the estimating unit 703 may refer to the operation 407 in FIG. 4 and FIG. 5, the contents of which are combined here and omitted here.

In some embodiments, as shown in FIG. 7, the apparatus 700 further includes:

a first serial-to-parallel converting unit 704, configured to perform serial-to-parallel conversion on a signal to be transmitted to obtain parallel digital signals of M paths as input signals of the digital impairment equalizer, M is the number of sub digital-to-analog converters contained in the time interleaved digital-to-analog converter:

a digital impairment equalizer 705, configured to perform pre-equalization processing on the parallel digital signals of M paths to obtain equalized signals as output signals of the digital impairment equalizer; and a parallel-to-serial converting unit 706, configured to perform parallel-to-serial conversion on the output signals of the digital impairment equalizer to obtain a serial digital signal as an input signal of the time interleaved digital-to-analog converter.

In some embodiments, the digital impairment equalizer is composed of a M×M multi-input multi-output finite impulse response filter and a coefficient vector for compensating direct current bias of a sub digital-to-analog converter of each path.

For example, in a case where interaction between sub-DACs is taken into account, the digital impairment equalizer may be represented as:

$$H=[H_1;H_2;\ldots;H_M]^T=\begin{bmatrix}h_{11}&\cdots&h_{1M}\\\vdots&\ddots&\vdots\\h_{M1}&\cdots&h_{MM}\end{bmatrix}+\begin{bmatrix}h_1^b\\\vdots\\h_M^b\end{bmatrix}$$

Output signals of the digital impairment equalizer may be represented as:

$$S=\begin{bmatrix}s_1[n]\\\vdots\\s_M[n]\end{bmatrix}=\begin{bmatrix}\sum_{i=1}^M h_{1i}*x_i[n]\\\vdots\\\sum_{i=1}^M h_{Mi}*x_i[n]\end{bmatrix}+\begin{bmatrix}h_1^b\\\vdots\\h_M^b\end{bmatrix}$$

wherein, $H_m$ is a m-th path digital impairment equalizer: $s_m[n]$ is an output signal of the m-th path digital impairment equalizer: $h_{mi}$ is a finite impulse response filter corresponding to the m-th path digital impairment equalizer, when i≠m, $h_{mi}$ is used to compensate for crosstalk from the i-th sub digital-to-analog converter to the m-th sub digital-to-analog converter: $h_m^b$ is a coefficient for compensating direct current bias: $x_i[n]$ is input signals of the digital impairment equalizer; i=1, 2, 3, ..., M, m=1, 2, 3, ..., M, M is the number of sub digital-to-analog converters contained in the time interleaved digital-to-analog converter.

For another example, in a case where interaction between sub-DACs is not taken into account, i.e., when $h_{mi}=0$ for i≠m, the digital impairment equalizer may be represented as:

$$H = [H_1; H_2; \ldots ; H_M]^T = \begin{bmatrix} h_{11} & \cdots & 0 \\ \vdots & \ddots & \vdots \\ 0 & \cdots & h_{MM} \end{bmatrix} + \begin{bmatrix} h_1^b \\ \vdots \\ h_M^b \end{bmatrix}$$

Output signals of the digital impairment equalizer may be represented as:

$$S = \begin{bmatrix} s_1[n] \\ \vdots \\ s_M[n] \end{bmatrix} = \begin{bmatrix} h_{11} * x_1[n] \\ \vdots \\ h_{MM} * x_M[n] \end{bmatrix} + \begin{bmatrix} h_1^b \\ \vdots \\ h_M^b \end{bmatrix}$$

wherein, $H_m$ is a m-th path digital impairment equalizer: $s_m[n]$ is an output signal of the m-th path digital impairment equalizer: $h_{mm}$ is a finite impulse response filter corresponding to the m-th path digital impairment equalizer: $h_m^b$ is a coefficient for compensating direct current bias of the m-th path digital impairment equalizer: $x_m[n]$ is input signals of the digital impairment equalizer: m=1, 2, 3, ..., M, M is the number of sub digital-to-analog converters contained in the time interleaved digital-to-analog converter.

In the above embodiment, operations of the first serial-to-parallel converting unit 704 may refer to the operation 401 in FIG. 4, operations of the digital impairment equalizer 705 may refer to the operation 402 in FIG. 4, and operations of the parallel-to-serial converting unit 706 may refer to the operation 403 in FIG. 4, the contents of which are combined here and omitted here.

In some embodiments, as shown in FIG. 7, the estimating unit 703 includes:

an estimator 7031, configured to process the output signals of the digital impairment equalizer according to a current coefficient of the estimator, to obtain an estimated value of the output signal of the time interleaved digital-to-analog converter; and a first calculating unit 7032, configured to calculate a coefficient of the digital impairment equalizer according to the input signals of the digital impairment equalizer, the estimated value of the output signal of the time interleaved digital-to-analog converter, and the current coefficient of the estimator.

In some embodiments, the estimator 7031 is composed of a M×M multi-input multi-output finite impulse response filter and a coefficient vector for characterizing DC bias of a sub digital-to-analog converter of each path.

For example, in a case where interaction between sub-DACs is taken into account, the estimator may be represented as:

$$\hat{G} = [\hat{G}_1; \hat{G}_2; \ldots ; \hat{G}_M]^T = \begin{bmatrix} \hat{g}_{11} & \cdots & \hat{g}_{1M} \\ \vdots & \ddots & \vdots \\ \hat{g}_{M1} & \cdots & \hat{g}_{MM} \end{bmatrix} + \begin{bmatrix} \hat{g}_1^b \\ \vdots \\ \hat{g}_M^b \end{bmatrix}$$

Output signals of the estimator may be represented as:

$$\hat{Y} = \begin{bmatrix} \hat{y}_1[n] \\ \vdots \\ \hat{y}_M[n] \end{bmatrix} = \begin{bmatrix} \sum_{i=1}^{M} \hat{g}_{1i} * s_i[n] \\ \vdots \\ \sum_{i=1}^{M} \hat{g}_{Mi} * s_i[n] \end{bmatrix} + \begin{bmatrix} \hat{g}_1^b \\ \vdots \\ \hat{g}_M^b \end{bmatrix}$$

wherein, $\hat{G}_m$ is a m-th path estimator, $\hat{y}_m[n]$ is an output of the m-th path estimator: $\hat{g}_{mi}$ is a finite impulse response filter corresponding to the m-th path estimator, when i≠m, $\hat{g}_{mi}$ is used to represent crosstalk from the i-th sub digital-to-analog converter to the m-th sub digital-to-analog converter: $\hat{g}_m^b$ is a coefficient for characterizing direct current bias: $s_i[n]$ is an input of the estimator: i=1, 2, 3, ..., M, m=1, 2, 3, ..., M, M is the number of sub digital-to-analog converters contained in the time interleaved digital-to-analog converter.

For another example, in a case where interaction between sub-DACs is not taken into account, i.e., when i≠m, $\hat{g}_{mi}=0$, the estimator may be represented as:

$$\hat{G} = [\hat{G}_1; \hat{G}_2; \ldots ; \hat{G}_M]^T = \begin{bmatrix} \hat{g}_{11} & \cdots & 0 \\ \vdots & \ddots & \vdots \\ 0 & \cdots & \hat{g}_{MM} \end{bmatrix} + \begin{bmatrix} \hat{g}_1^b \\ \vdots \\ \hat{g}_M^b \end{bmatrix}$$

Output signals of the estimator may be represented as:

$$\hat{Y} = \begin{bmatrix} \hat{y}_1[n] \\ \vdots \\ \hat{y}_M[n] \end{bmatrix} = \begin{bmatrix} \hat{g}_{11} * s_1[n] \\ \vdots \\ \hat{g}_{MM} * s_M[n] \end{bmatrix} + \begin{bmatrix} \hat{g}_1^b \\ \vdots \\ \hat{g}_M^b \end{bmatrix}$$

wherein, $\hat{G}_m$ is a m-th path estimator: $\hat{y}_m[n]$ is an output signal of the m-th path estimator: $\hat{g}_{mm}$ is a finite impulse response filter corresponding to the m-th path estimator; $\hat{g}_{mi}$ is a coefficient for characterizing direct current bias of the m-th path estimator; $s_m[n]$ is an input signal of the m-th path estimator; m=1, 2, 3, ..., M, M is the number of sub digital-to-analog converters contained in the time interleaved digital-to-analog converter.

In some embodiments, as shown in FIG. 7, the estimating unit 703 further includes:

a second serial-to-parallel converting unit 7033, configured to perform serial-to-parallel conversion on the preprocessed measurement signal to obtain parallel digital signals of M paths, M is the number of sub digital-to-analog converters contained in the time interleaved digital-to-analog converter; and a second calculating unit 7034, configured to calculate the coefficient of the estimator by using the parallel digital signals of M paths, the output signals of the digital impairment equalizer and the estimated value of the output signal of the time interleaved digital-to-analog converter.

In the above embodiment, operations of the estimator 7031 may refer to the operation 502 in FIG. 5, operations of the first calculating unit 7032 may refer to the operation 504 in FIG. 5, operations of the second serial-to-parallel converting unit 7033 may refer to the operation 501 in FIG. 5, and operations of the second calculating unit 7034 may refer to the operation 503 in FIG. 5, the contents of which are combined here and omitted here.

It should be noted that the above FIG. 7 is only schematic description of the embodiments of the present disclosure, but the present disclosure is not limited to this. For example, each component can be adjusted appropriately, moreover other some components can be increased or reduced. Persons skilled in the art can make appropriate modifications according to the above contents, not limited to the records in the above FIG. 7.

Each of the above embodiments is only illustrative for the embodiments of the present disclosure, but the present disclosure is not limited to this, appropriate modifications can be also made based on the above each embodiment. For example, each of the above embodiments may be used individually, or one or more of the above embodiments may be combined.

According to the apparatus in the embodiments of the present disclosure, by preprocessing a non-ideal measurement signal, interferences introduced by a non-ideal measurement feedback channel is eliminated, which avoids the influence of the interference on the performance of the digital impairment equalizer. In addition, a mismatch error compensation may be performed independently for each sub-DAC, thereby to greatly reduce the complexity of the whole compensation method.

The embodiments of the present disclosure provide a communication system.

Figure 8:
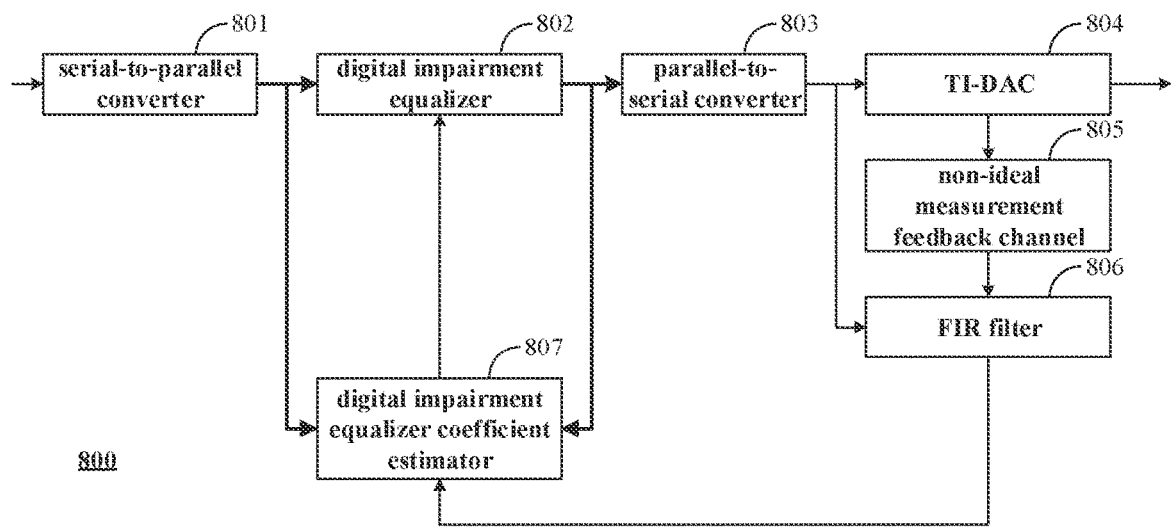

FIG. 8 is a schematic diagram of a communication system in the embodiments of the present disclosure, as shown in FIG. 8, the communication system 800 includes: a serial-to-parallel converter 801, a digital impairment equalizer 802, a parallel-to-serial converter 803, a time interleaved digital-to-analog converter 804, a non-ideal measurement feedback channel 805, a FIR filter 806, and a digital impairment equalizer coefficient estimator 807.

In the above embodiment, the serial-to-parallel converter 801 serves as the first serial-to-parallel converting unit 704 to realize the function of the operation 401 in FIG. 4, the digital impairment equalizer 802 is used to realize the function of the operation 402 in FIG. 4, the parallel-to-serial converter 803 serves as the parallel-to-serial converting unit 706 to realize the function of the operation 403 in FIG. 4, the time interleaved digital-to-analog converter 804 is used to realize the function of the operation 404 in FIG. 4, the non-ideal measurement feedback channel 805 serves as the sampling unit 701 to realize the function of the operation 405 in FIG. 4, the FIR filter 806 serves as the preprocessing unit 702 to realize the function of the operation 406 in FIG. 4, and the digital impairment equalizer coefficient estimator 807 serves as the estimating unit 703 to realize the function of the operation 407 in FIG. 4. Since each constituent part of the communication system 800 has been described in details in the embodiments of the first aspect, its content is combined here and is omitted here.

Figure 9:
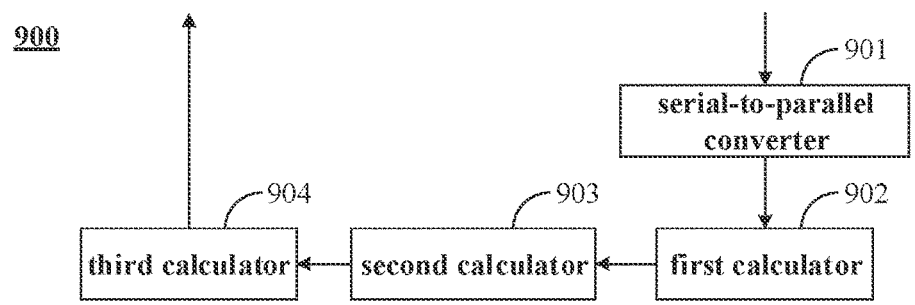

FIG. 9 is a schematic diagram of an example of a digital impairment equalizer coefficient estimator 807, as shown in FIG. 9, the digital impairment equalizer coefficient estimator 807 includes: a serial-to-parallel converter 901, a first calculator 902, a second calculator 903 and a third calculator 904.

In the above embodiment, the serial-to-parallel converter 901 serves as the second serial-to-parallel converting unit 7033 to realize the function of the operation 601 in FIG. 6, the first calculator 902 serves as the second calculating unit 7034 to realize the function of the operation 603 in FIG. 6, the second calculator 903 serves as the estimator 7031 to realize the function of the operation 602 in FIG. 6, and the third calculator 904 serves as the first calculating unit 7032 to realize the function of the operation 604. Since each constituent part of the digital impairment equalizer coefficient estimator 807 has been described in details in the embodiments of the first aspect, its content is combined here and is omitted here.

The above FIGS. 8 and 9 only describe compositions and functions of the communication system and the digital impairment equalizer coefficient estimator relevant to the present disclosure, the communication system and the digital impairment equalizer coefficient estimator may also include other constituent parts, relevant technologies may be referred to and a description thereto is omitted here.

The embodiments of the present disclosure further provide a computer readable program, wherein when the program is executed in a mismatch error calibration apparatus of a time interleaved digital-to-analog converter or a computer device, the program causes the mismatch error calibration apparatus of the time interleaved digital-to-analog converter or the computer device to perform the method described in the embodiments of the first aspect.

The embodiments of the present disclosure provide a storage medium storing a computer readable program, wherein the computer readable program causes a mismatch error calibration apparatus of a time interleaved digital-to-analog converter or a computer device to perform the method as described in embodiments of the first aspect.

The apparatus and method in the present disclosure can be realized by hardware, or can be realized by combining hardware with software. The present disclosure relates to such a computer readable program, when the program is executed by a logic component, the computer readable program enables the logic component to realize the apparatus or constituent components described in the above text, or enables the logic component to realize various methods or operations described in the above text. The present disclosure also relates to a storage medium storing the program, such as a hard disk, a magnetic disk, an optical disk, a DVD, a flash memory and the like.

By combining with the method/apparatus described in the embodiments of the present disclosure, it can be directly reflected as hardware, a software executed by a processor, or a combination of the two. For example, one or more in the functional block diagram or one or more combinations in the functional block diagram as shown in the figures may correspond to software modules of a computer program flow; and may also correspond to hardware modules. These software modules may respectively correspond to the operations as shown in the figures. These hardware modules can be realized by solidifying these software modules e.g. using a field-programmable gate array (FPGA).

A software module can be located in a RAM memory, a flash memory, a ROM memory, an EPROM memory, an EEPROM memory, a register, a hard disk, a mobile magnetic disk, a CD-ROM or a storage medium in any other form as known in this field. A storage medium can be coupled to a processor, thereby enabling the processor to read information from the storage medium, and to write the information into the storage medium: or the storage medium can be a constituent part of the processor. The processor and the storage medium can be located in an ASIC. The software module can be stored in a memory of a mobile terminal, and may also be stored in a memory card of the mobile terminal. For example, if a device (such as the mobile terminal) adopts a MEGA-SIM card with a larger capacity or a flash memory apparatus with a large capacity; the software module can be stored in the MEGA-SIM card or the flash memory apparatus with a large capacity.

One or more in the functional block diagram or one or more combinations in the functional block diagram as described in the figures can be implemented as a general-purpose processor for performing the functions described in the present disclosure, a digital signal processor (DSP), an application-specific integrated circuit (ASIC), a field-programmable gate array (FPGA) or other programmable logic device, discrete gate or transistor logic device, discrete hardware components or any combination thereof. One or more in the functional block diagram or one or more combinations in the functional block diagram as described in the figures can be also implemented as a combination of computer equipment(s), such as a combination of a DSP and a microprocessor, a plurality of microprocessors, one or more microprocessors combined and communicating with the DSP or any other such configuration.

The present disclosure is described by combining with the specific implementations, however persons skilled in the art should clearly know that these descriptions are exemplary and do not limit the protection scope of the present disclosure. Persons skilled in the art can make various variations and modifications to the present disclosure based on the spirit and principle of the present disclosure, these variations and modifications are also within the scope of the present disclosure.

As for the implementations including the above embodiments, the following supplements are also disclosed:

1. A mismatch error calibration method of a time interleaved digital-to-analog converter, wherein the method includes:
   sampling an output signal of the time interleaved digital-to-analog converter to obtain a measurement signal:
   preprocessing the measurement signal to obtain a preprocessed measurement signal: and
   estimating a coefficient of a digital impairment equalizer according to an input signal of the digital impairment equalizer, an output signal of the digital impairment equalizer, and the preprocessed measurement signal.
2. The method according to the supplement 1, wherein
   the measurement signal includes impairment and interference introduced by a non-ideal measurement feedback channel;
   the non-ideal measurement feedback channel includes a physical connection device connected to the time interleaved digital-to-analog converter, and a receiving equipment.
3. The method according to the supplement 1, wherein preprocessing the measurement signal includes:
   taking the input signal of the time interleaved digital-to-analog converter as a reference, and filtering the measurement signal by using a finite impulse response filter, to obtain the preprocessed measurement signal.
4. The method according to the supplement 1, wherein the method further includes:
   performing serial-to-parallel conversion on a signal to be transmitted to obtain parallel digital signals of M paths as input signals of the digital impairment equalizer, M is the number of sub digital-to-analog converters contained in the time interleaved digital-to-analog converter;
   performing pre-equalization processing on the parallel digital signals of M paths according to the coefficient of the digital impairment equalizer, to obtain equalized signals as output signals of the digital impairment equalizer; and
   performing parallel-to-serial conversion on the output signals of the digital impairment equalizer to obtain a serial digital signal as an input signal of the time interleaved digital-to-analog converter.
5. The method according to the supplement 4, wherein
   the digital impairment equalizer that pre-equalizes parallel digital signals of each path is composed of M finite impulse response filters with the number of taps being N, and a coefficient for compensating direct current bias:
   the digital impairment equalizer that pre-equalizes parallel digital signals of all paths is composed of a M×M multi-input multi-output finite impulse response filter and a coefficient vector for compensating direct current bias of a sub digital-to-analog converter of each path.
5.1. The method according to the supplement 5, wherein the digital impairment equalizer is represented as:

$$H = [H_1; H_2; \ldots ; H_M]^T = \begin{bmatrix} h_{11} & \cdots & h_{1M} \\ \vdots & \ddots & \vdots \\ h_{M1} & \cdots & h_{MM} \end{bmatrix} + \begin{bmatrix} h_1^b \\ \vdots \\ h_M^b \end{bmatrix}$$

the output signals of the digital impairment equalizer are represented as:

$$S = \begin{bmatrix} s_1[n] \\ \vdots \\ s_M[n] \end{bmatrix} = \begin{bmatrix} \sum_{i=1}^{M} h_{1i} * x_i[n] \\ \vdots \\ \sum_{i=1}^{M} h_{Mi} * x_i[n] \end{bmatrix} + \begin{bmatrix} h_1^b \\ \vdots \\ h_M^b \end{bmatrix}$$

wherein, $H_m$ is a m-th path digital impairment equalizer: $s_m[n]$ is an output signal of the m-th path digital impairment equalizer: $h_{mi}$ is a finite impulse response filter corresponding to the m-th path digital impairment equalizer, when i≠m, $h_{mi}$ is used to compensate for crosstalk from the i-th sub digital-to-analog converter to the m-th sub digital-to-analog converter: $h_m^b$ is a coefficient for compensating direct current bias: $x_i[n]$ is input signals of the digital impairment equalizer; i=1, 2, 3, . . . , M, m=1, 2, 3, . . . , M, M is the number of sub digital-to-analog converters contained in the time interleaved digital-to-analog converter.

5.2. The method according to the supplement 5, wherein the digital impairment equalizer is represented as:

$$H = [H_1; H_2; \ldots ; H_M]^T = \begin{bmatrix} h_{11} & \cdots & 0 \\ \vdots & \ddots & \vdots \\ 0 & \cdots & h_{MM} \end{bmatrix} + \begin{bmatrix} h_1^b \\ \vdots \\ h_M^b \end{bmatrix}$$

the output signals of the digital impairment equalizer are represented as:

$$S = \begin{bmatrix} s_1[n] \\ \vdots \\ s_M[n] \end{bmatrix} = \begin{bmatrix} h_{11} * x_1[n] \\ \vdots \\ h_{MM} * x_M[n] \end{bmatrix} + \begin{bmatrix} h_1^b \\ \vdots \\ h_M^b \end{bmatrix}$$

wherein, $H_m$ is a m-th path digital impairment equalizer: $s_m[n]$ is an output signal of the m-th path digital impairment equalizer: $h_{mm}$ is a finite impulse response filter corresponding to the m-th path digital impairment equalizer: $h_m^b$ is a coefficient for compensating direct current bias: $x_m[n]$ is input signals of the digital impairment equalizer: m=1, 2, 3, ..., M, M is the number of sub digital-to-analog converters contained in the time interleaved digital-to-analog converter.

6. The method according to the supplement 1, wherein estimating a coefficient of the digital impairment equalizer includes:

processing the output signals of the digital impairment equalizer according to a current coefficient of the estimator, to obtain an estimated value of the output signal of the time interleaved digital-to-analog converter; and calculating a coefficient of the digital impairment equalizer according to the input signals of the digital impairment equalizer, the estimated value of the output signal of the time interleaved digital-to-analog converter, and the current coefficient of the estimator.

7. The method according to the supplement 6, wherein the estimator that processes an output signal of each path of the digital impairment equalizer is composed of M finite impulse response filters with the number of taps being K, and a coefficient for characterizing direct current bias:

the digital impairment equalizer that processes output signals of all paths of the digital impairment equalizer is composed of a M×M multi-input multi-output finite impulse response filter and a coefficient vector for compensating direct current bias of a sub digital-to-analog converter of each path.

7.1. The method according to the supplement 7, wherein the estimator is represented as:

$$\hat{G} = [\hat{G}_1; \hat{G}_2; \ldots ; \hat{G}_M]^T = \begin{bmatrix} \hat{g}_{11} & \cdots & \hat{g}_{1M} \\ \vdots & \ddots & \vdots \\ \hat{g}_{M1} & \cdots & \hat{g}_{MM} \end{bmatrix} + \begin{bmatrix} \hat{g}_1^b \\ \vdots \\ \hat{g}_M^b \end{bmatrix}$$

the output signals of the estimator are represented as:

$$\hat{Y} = \begin{bmatrix} \hat{y}_1[n] \\ \vdots \\ \hat{y}_M[n] \end{bmatrix} = \begin{bmatrix} \sum_{i=1}^{M} \hat{g}_{1i} * s_1[n] \\ \vdots \\ \sum_{i=1}^{M} \hat{g}_{Mi} * s_1[n] \end{bmatrix} + \begin{bmatrix} \hat{g}_1^b \\ \vdots \\ \hat{g}_M^b \end{bmatrix}$$

wherein, $\hat{G}_m$ is a m-th path estimator, $\hat{y}_m[n]$ is an output of the m-th path estimator; $\hat{g}_{mi}$ is a finite impulse response filter corresponding to the m-th path estimator, when i≠m, $\hat{g}_{mi}$ is used to represent crosstalk from the i-th sub digital-to-analog converter to the m-th sub digital-to-analog converter: $\hat{g}_m^b$ h is a coefficient for characterizing direct current bias: $s_i[n]$ is an input of the estimator: i=1, 2, 3, ..., M, m=1, 2, 3, ..., M, M is the number of sub digital-to-analog converters contained in the time interleaved digital-to-analog converter.

7.2. The method according to the supplement 7, wherein the estimator is represented as:

$$\hat{G} = [\hat{G}_1; \hat{G}_2; \ldots ; \hat{G}_M]^T = \begin{bmatrix} \hat{g}_{11} & \cdots & 0 \\ \vdots & \ddots & \vdots \\ 0 & \cdots & \hat{g}_{MM} \end{bmatrix} + \begin{bmatrix} \hat{g}_1^b \\ \vdots \\ \hat{g}_M^b \end{bmatrix}$$

the output signals of the estimator are represented as:

$$\hat{Y} = \begin{bmatrix} \hat{y}_1[n] \\ \vdots \\ \hat{y}_M[n] \end{bmatrix} = \begin{bmatrix} \hat{g}_{11} * s_1[n] \\ \vdots \\ \hat{g}_{MM} * s_M[n] \end{bmatrix} + \begin{bmatrix} \hat{g}_1^b \\ \vdots \\ \hat{g}_M^b \end{bmatrix}$$

wherein, $\hat{G}_m$ is a m-th path estimator; $\hat{y}_m[n]$ is an output of the m-th path estimator; $\hat{g}_{mm}$ is a finite impulse response filter corresponding to the m-th path estimator; $\hat{g}_m^b$ is a coefficient for characterizing direct current bias; $s_m[n]$ is an input signal of the estimator; m=1, 2, 3, ..., M, M is the number of sub digital-to-analog converters contained in the time interleaved digital-to-analog converter.

8. The method according to the supplement 6, wherein estimating a coefficient of the digital impairment equalizer further includes:

performing serial-to-parallel conversion on the preprocessed measurement signal to obtain parallel digital signals of M paths, M is the number of sub digital-to-analog converters contained in the time interleaved digital-to-analog converter; and calculating the coefficient of the estimator by using the parallel digital signals of M paths, the output signals of the digital impairment equalizer and the estimation of the time interleaved digital-to-analog converter.

What is claimed is:

1. A mismatch error calibration apparatus of a time interleaved digital-to-analog converter, comprising:
   a memory; and
   a processor coupled to the memory to control execution of a process to:
     sample an output signal of the time interleaved digital-to-analog converter to obtain a measurement signal:
     preprocess the measurement signal to obtain a preprocessed measurement signal:
     estimate a coefficient of a digital impairment equalizer according to an input signal of the digital impairment equalizer, an output signal of the digital impairment equalizer, and the preprocessed measurement signal.

2. The mismatch error calibration apparatus according to claim 1, wherein,
   the measurement signal includes impairment and interference introduced by a non-ideal measurement feedback channel:
   the non-ideal measurement feedback channel includes a physical connection device connected to the time interleaved digital-to-analog converter, and a receiving equipment.

3. The mismatch error calibration apparatus according to claim 1, wherein,
   the processor takes an input signal of the time interleaved digital-to-analog converter as a reference, and filters the measurement signal by using a finite impulse response filter, to obtain the preprocessed measurement signal.

4. The mismatch error calibration apparatus according to claim 1, wherein the execution of the process by the processor further comprises:
performing serial-to-parallel conversion on a signal to be transmitted to obtain parallel digital signals of M paths as input signals of the digital impairment equalizer, M being a number of sub digital-to-analog converters contained in the time interleaved digital-to-analog converter;
performing pre-equalization processing on the parallel digital signals of M paths according to the coefficient of the digital impairment equalizer, to obtain equalized signals as output signals of the digital impairment equalizer; and
performing parallel-to-serial conversion on the output signals of the digital impairment equalizer to obtain a serial digital signal as an input signal of the time interleaved digital-to-analog converter.

5. The mismatch error calibration apparatus according to claim 4, wherein,
the digital impairment equalizer is composed of a M×M multi-input multi-output finite impulse response filter and a coefficient vector for compensating direct current bias of a sub digital-to-analog converter of each path.

6. The mismatch error calibration apparatus according to claim 5, wherein,
the digital impairment equalizer is represented as:

$$H = [H_1; H_2; \ldots ; H_M]^T = \begin{bmatrix} h_{11} & \cdots & 0 \\ \vdots & \ddots & \vdots \\ 0 & \cdots & h_{MM} \end{bmatrix} + \begin{bmatrix} h_1^b \\ \vdots \\ h_M^b \end{bmatrix}$$

the output signals of the digital impairment equalizer are represented as:

$$S = \begin{bmatrix} s_1[n] \\ \vdots \\ s_M[n] \end{bmatrix} = \begin{bmatrix} h_{11} * x_1[n] \\ \vdots \\ h_{MM} * x_M[n] \end{bmatrix} + \begin{bmatrix} h_1^b \\ \vdots \\ h_M^b \end{bmatrix}$$

wherein, $H_m$ is a m-th path digital impairment equalizer; $S_m[n]$ is an output signal of the m-th path digital impairment equalizer; $h_{mm}$ is a finite impulse response filter corresponding to the m-th path digital impairment equalizer; $h_m^b$ is a coefficient for compensating direct current bias, of the m-th path digital impairment equalizer; $x_m[n]$ is input signals of the digital impairment equalizer; m=1, 2, 3, ..., M, M is the number of sub digital-to-analog converters contained in the time interleaved digital-to-analog converter.

7. The mismatch error calibration apparatus according to claim 1, wherein the coefficient of the digital impairment equalizer is estimated by:

processing output signals of the digital impairment equalizer according to a current coefficient of an estimator, to obtain an estimated value of the output signal of the time interleaved digital-to-analog converter; and
calculating a coefficient of the digital impairment equalizer according to input signals of the digital impairment equalizer, the estimated value of the output signal of the time interleaved digital-to-analog converter, and the current coefficient of the estimator.

8. The mismatch error calibration apparatus according to claim 7, wherein,
the estimator is composed of a M×M multi-input multi-output finite impulse response filter and a coefficient vector for characterizing direct current bias of a sub digital-to-analog converter of each path.

9. The mismatch error calibration apparatus according to claim 8, wherein,
the estimator is represented as:

$$\hat{G} = [\hat{G}_1; \hat{G}_2; \ldots ; \hat{G}_M]^T = \begin{bmatrix} \hat{g}_{11} & \cdots & 0 \\ \vdots & \ddots & \vdots \\ 0 & \cdots & \hat{g}_{MM} \end{bmatrix} + \begin{bmatrix} \hat{g}_1^b \\ \vdots \\ \hat{g}_M^b \end{bmatrix}$$

the output signals of the estimator are represented as:

$$\hat{Y} = \begin{bmatrix} \hat{y}_1[n] \\ \vdots \\ \hat{y}_M[n] \end{bmatrix} = \begin{bmatrix} \hat{g}_{11} * s_1[n] \\ \vdots \\ \hat{g}_{MM} * s_M[n] \end{bmatrix} + \begin{bmatrix} \hat{g}_1^b \\ \vdots \\ \hat{g}_M^b \end{bmatrix}$$

wherein, $\hat{G}_m$ is a m-th path estimator; $\hat{y}_m[n]$ is an output signal of the m-th path estimator; $\hat{g}_{mm}$ is a finite impulse response filter corresponding to the m-th path estimator; $\hat{g}_m^b$ is a coefficient for characterizing direct current bias, of the m-th path estimator; $s_m[n]$ is an input signal of the m-th path estimator; m=1, 2, 3, ..., M, M is a number of sub digital-to-analog converters contained in the time interleaved digital-to-analog converter.

10. The mismatch error calibration apparatus according to claim 7, wherein the coefficient of the digital impairment equalizer is estimated by:
performing serial-to-parallel conversion on the preprocessed measurement signal to obtain parallel digital signals of M paths, M being a number of sub digital-to-analog converters contained in the time interleaved digital-to-analog converter; and
calculating the coefficient of the estimator by using the parallel digital signals of M paths, the output signals of the digital impairment equalizer and the estimated value of the output signal of the time interleaved digital-to-analog converter.

* * * * *